United States Patent [19]
Oberg et al.

[11] Patent Number: 5,751,149
[45] Date of Patent: May 12, 1998

[54] METHOD AND APPARATUS FOR HIGH FREQUENCY TIME DOMAIN REFLECTOMETRY

[75] Inventors: Arthur E. Oberg, Vista; Charles H. Wissman, Oceanside, both of Calif.

[73] Assignee: Tempo Research Corporation, Vista, Calif.

[21] Appl. No.: 569,503

[22] Filed: Dec. 8, 1995

[51] Int. Cl.$^6$ .................................................. G01R 31/11
[52] U.S. Cl. ........................ 324/533; 324/534; 324/535; 324/642; 324/644
[58] Field of Search .................................. 324/642, 644, 324/532, 533, 534, 535

[56] References Cited

U.S. PATENT DOCUMENTS

| | | | |
|---|---|---|---|
| 3,470,331 | 9/1969 | Barash | 324/533 |
| 3,600,674 | 8/1971 | Roberts | 324/534 |
| 3,753,086 | 8/1973 | Shoemaker | 324/533 |
| 4,404,514 | 9/1983 | Reichert | 324/533 |
| 5,144,250 | 9/1992 | Little | 324/533 |

FOREIGN PATENT DOCUMENTS 0129770  10/1980  Japan ........................ 324/520

Primary Examiner—Ernest F. Karlsen
Assistant Examiner—Jose M. Solis
Attorney, Agent, or Firm—Amster, Rothstein & Ebenstein

[57] ABSTRACT

An apparatus and method is disclosed for the location of faults occurring within transmission systems. The disclosed apparatus and method allows a user to adjust the center frequency of a pulse output by a standard narrow bandwidth time domain reflectometer, without altering the bandwidth of the output pulse. As a result, the detection of faults occurring at a wide range of frequencies is enabled—while the cost associated with widening the bandwidth of the transmitted pulse is not incurred. Moreover, due to the narrower bandwidth, efficient fault detection is achieved as well for high frequency systems as for low frequency systems.

23 Claims, 2 Drawing Sheets

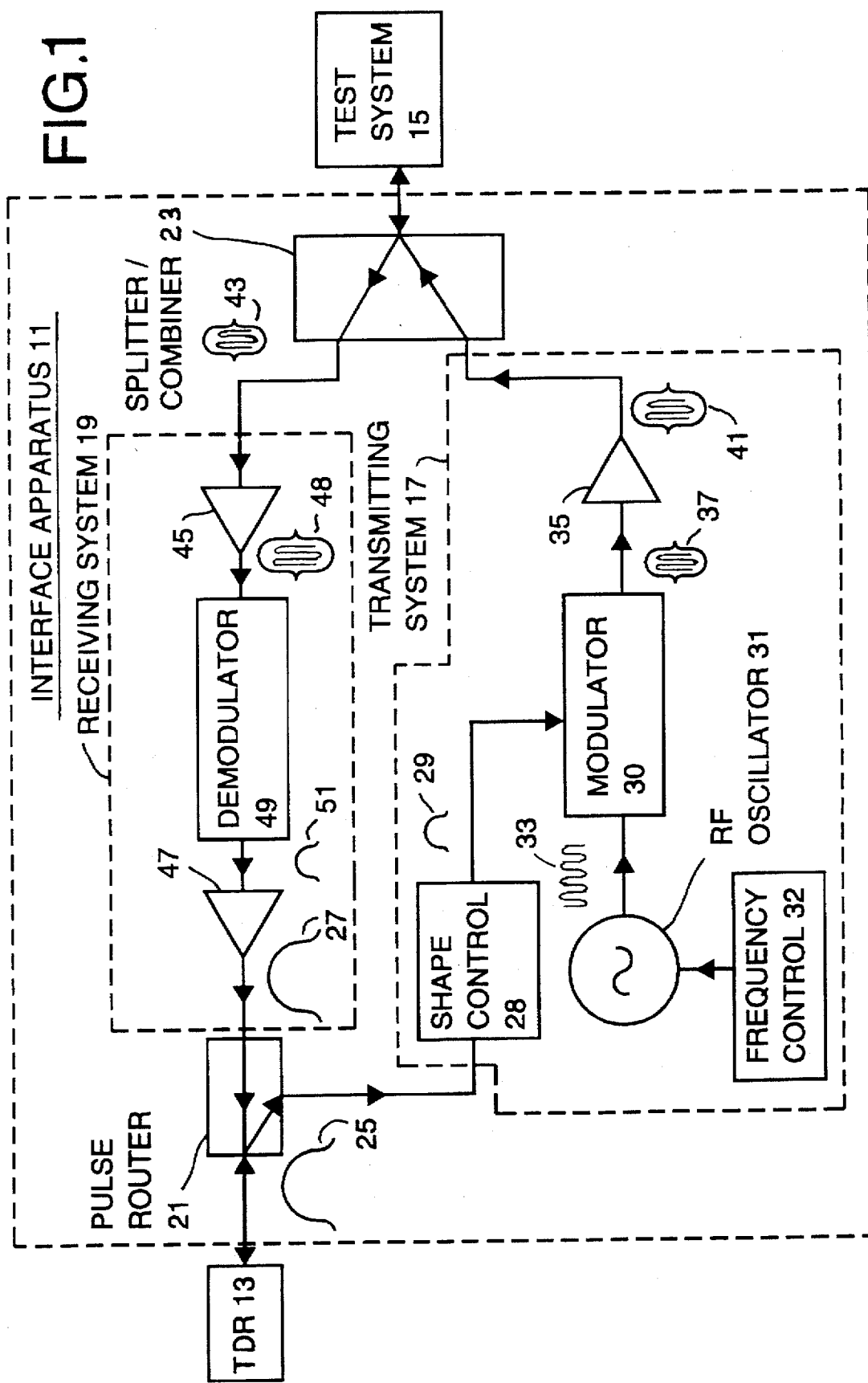

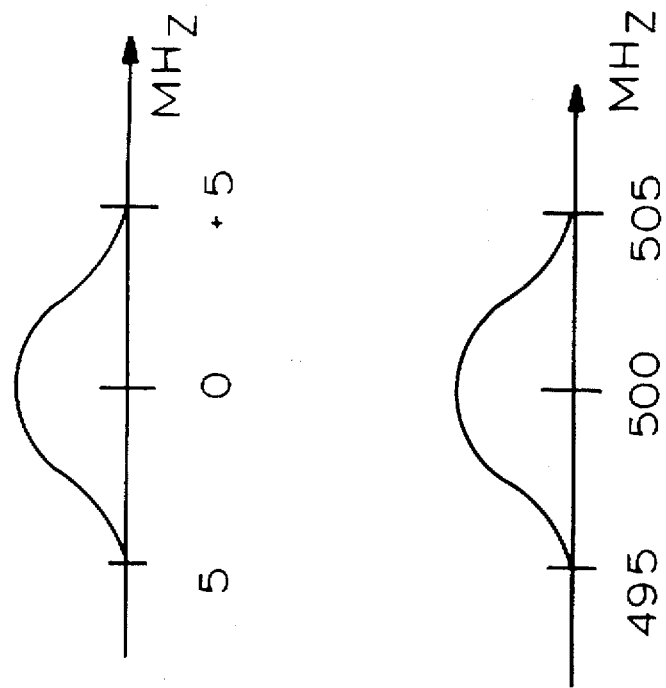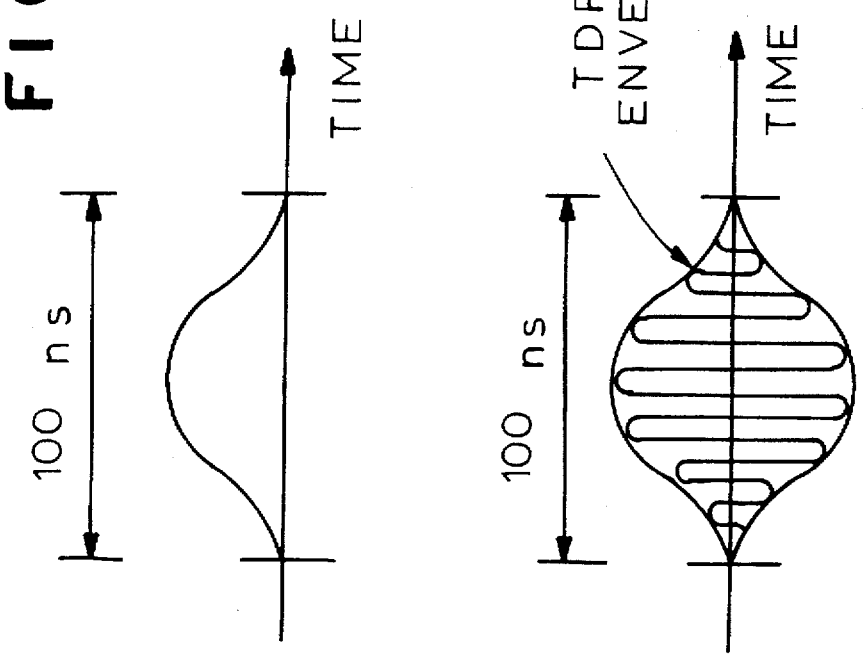

METHOD AND APPARATUS FOR HIGH FREQUENCY TIME DOMAIN REFLECTOMETRY

BACKGROUND

The present invention relates to an improved method and apparatus for achieving high frequency time domain reflectometry; specifically to an improved method and apparatus for inexpensively probing a transmission line over a wide frequency spectrum, while allowing the use of inexpensive narrow bandwidth TDR circuitry.

Time domain reflectometry schemes are commonly used within the telephone and cable television industries. A Time Domain Reflectometer ("TDR") sends a single pulse down a transmission line and then monitors the transmission line for any reflections of that pulse. The normal impedance of a transmission line is altered when a fault occurs, thus resulting in an impedance mismatch between the impedance at the fault location and the impedance of the non-faulted portions of the line. As a pulse output by a TDR ("TDR Pulse") reaches the fault which caused this impedance mismatch, a portion of the TDR pulse is reflected ("Reflected Pulse") back to the TDR. The magnitude of the Reflected Pulse is proportional to the magnitude of the impedance mismatch and, therefore, the magnitude of the fault. Because the Reflected Pulse travels down the transmission line at a known, given speed, the exact location of the fault may be determined by monitoring the time at which the TDR pulse is transmitted to the line and the time at which the Reflected Pulse is received by the TDR.

Commercially available TDR's operate over a specific range of frequencies ("bandwidth") with the center frequency being zero or DC. Most TDR devices operate over a frequency range or bandwidth of about 100 MHz. A few, very expensive, TDR's operate over a wide bandwidth of 500 MHz (i.e., −250 MHz to +250 MHz). Thus, these more expensive TDR's can detect faults which occur in the zero to 250 MHz range. However, because the energy of the pulse output by these wide bandwidth TDR's is distributed over a wide bandwidth, these TDR's are ineffective and many faults remain undetected.

U.S. Pat. No. 5,144,250 to Little discloses a radio frequency ("RF") amplifier which is capable of performing RF time domain reflectometry measurements (the "Little Device"). The Little Device employs a digital counter to measure the difference between the time an RF signal is output from the RF amplifier, and the time a reflected portion of the RF signal returns to the Little Device. The Little Device takes a base band frequency data signal from a data source and uses an RF exciter to produce an RF modulated version of the data signal. Thereafter, a portion of the RF modulated signal is used as the clock input to a digital counter. The remainder of the RF modulated signal is then amplified and is again split; one portion starts the digital counter and the remaining portion is transmitted to the system under test. A portion of the transmitted signal will be reflected by the first fault encountered. A portion of this reflected signal will be coupled to the digital counter, thereby stopping the counter. By knowing the frequency at which the counter operates and the total number of clock pulses counted, one can determine the distance to the first fault. The Little Device feeds this frequency and count information to a comparison table to determine which component in the system contains the first fault. The Little Device can detect only one fault—the first fault. This fault must be corrected before additional faults farther along the transmission line can be detected. In sum, the Little Device provides self-diagnoses of a first fault occurring in a specific system, and is therefore not transportable to other systems.

Until now, a technician responsible for monitoring and repairing a high frequency transmission system (such as those presently used in the telephone and cable television industries) would be required to purchase an expensive TDR having a bandwidth wide enough to include the operating frequency of the high frequency transmission system to be tested. Even with wide bandwidth TDR's, many high frequency faults remain undetected because the TDR's energy is widely distributed while the fault's energy is narrowly distributed.

Thus, although presently known TDR's work well for transmission systems where the bandwidth is limited to below 100 MHz, the TDR's presently known have difficulty detecting faults above 100 MHz. The ability to detect faults occurring at frequencies over 100 MHz has become very important with the development and installation of transmission systems operating at very wide bandwidths (such as those used for the "information superhighway"). Presently known TDR systems are not able to meet the needs of these wide bandwidth systems: with a narrow bandwidth TDR, faults occurring at a frequency that is outside the limited bandwidth of the TDR output pulse remain undetected, yet wide bandwidth TDR's are ineffective and often fail to detect faults which occur within the bandwidth of their output pulse. Thus, a need exists for a single, cost-effective device which accurately provides general purpose time domain reflectometry measurements over a wide range of frequencies.

Accordingly, it is an object of the present invention to provide a system which detects high frequency faults more efficiently than systems previously known.

It is a further object of the present invention to provide a general purpose method for accurately detecting and mapping faults occurring within a system under test, regardless of the system's operating frequency.

Another object of the invention is to provide an interface apparatus which will allow general purpose narrow bandwidth TDR's to be used to locate high frequency faults. Such an apparatus will provide users with a substantial cost savings, as only a single, inexpensive, narrow bandwidth TDR will need to be purchased. The need for expensive, wide bandwidth TDR's will be eliminated.

Still another object of the invention is to provide an apparatus which may be adjusted for detection of faults which occur at low or high frequencies. Thus, the invention may advantageously be integrated with standard, narrow bandwidth time domain reflectometry circuitry, thereby providing a single device which may be adjusted for fault detection on any system, regardless of the system's operating frequency.

BRIEF DESCRIPTION OF THE DRAWINGS

FIG. 1 is a circuit diagram of the apparatus of the present invention, in accordance with a preferred embodiment;

FIG. 2(a) represents a pulse output by a standard TDR shown in time domain;

FIG. 2(b) represents a pulse output by a standard TDR shown in frequency domain;

FIG. 3(a) represents a pulse output by the apparatus of the present invention shown in time domain; and FIG. 3(b) represents a pulse output by the apparatus of the present invention shown in frequency domain.

DETAILED DESCRIPTION OF THE PREFERRED EMBODIMENT

The present invention provides a cost-effective solution to the need to locate faults within a high frequency transmission system. With the present invention, a user is able to adjust the center frequency of a transmitted pulse while maintaining the same bandwidth. As a result, the detection of faults occurring at a wide range of frequencies is enabled—while the cost associated with widening the bandwidth of the transmitted pulse is not incurred. Moreover, due to the narrower bandwidth, efficient fault detection is achieved as well for high frequency systems as for low frequency systems.

In operation, the apparatus of the present invention shifts the center frequency of a TDR pulse to an adjustable, operator determined frequency. When a fault reflects a portion of the TDR pulse back to the interface circuit of the present invention, the interface circuit shifts the center frequency of the Reflected Pulse back to zero, prior to passing the Reflected Pulse to the TDR. Thus, the interface apparatus of the present invention is virtually invisible to the TDR. Additionally, all the features which are performed by a standard, narrow bandwidth TDR are able to be performed at high frequencies through use of the interface circuit, as though performed by the narrow bandwidth TDR itself.

A preferred embodiment of the present invention features the ability to adjust the center frequency of the output pulse, and the ability to control the specific shape of the output pulse. Although the present invention is preferably an interface between the TDR and the transmission system, it may also be incorporated within the housing of a standard TDR.

FIG. 1 is a circuit diagram of the apparatus of the presently preferred embodiment of the invention, shown as an interface 11 between a standard TDR 13 and a transmission system under test 15 ("Test System 15"). Interface 11 comprises a transmitting system 17 and a receiving system 19. Although not shown within either transmitting system 17 or receiving system 19, a pulse router 21 and a splitter/combiner 23 comprise part of both transmitting system 17 and receiving system 19. TDR 13 is coupled to pulse router 21 so that TDR 13 can transmit a TDR output pulse 25 ("TDR pulse 25") to pulse router 21, or can receive a demodulated fault Reflected Pulse 27 ("Reflected Pulse 27") from pulse router 21. Pulse router 21 is coupled so as to transmit TDR output pulse 25 through a shape control circuit 28, to a modulator 30. Modulator 30 is coupled to an RF oscillator 31 so as to receive an RF signal 33 therefrom. Modulator 30 is coupled to an amplifier 35 so that a modulated output pulse 37 ("Output Pulse 37") output by modulator 30 is passed to amplifier 35. Modulator 30 may comprise a variable gain amplifier or other alternative means for controlling the shape of Output Pulse 37, and shape control circuit 28 may comprise a low pass filter or a one shot circuit.

The output of amplifier 35 is coupled to an input of splitter/combiner 23 so that an amplified modulated Output Pulse 41 ("Output Pulse 41") may be transmitted from amplifier 35 to splitter/combiner 23. Splitter/combiner 23 comprises a circuit which is commonly known to a worker of ordinary skill in the art, and can be easily designed or purchased as a prepackaged circuit. Splitter/combiner 23 is coupled to Test System 15 so that Output Pulse 41 may be transmitted to Test System 15 and a fault reflected signal 43 ("Reflected Pulse 43") may be received from Test System 15. Splitter/combiner 23 is configured so as to prevent Output Pulse 41 from entering Receiving System 19.

Thus, transmitting system 17 contains a frequency control 32, RF oscillator 31, modulator 30, shape control circuit 28, amplifier 35 as well as pulse router 21 and splitter/combiner 23.

Receiving System 19 comprises amplifiers 45 and 47 and a demodulator 49 as well as splitter/combiner 23 and pulse router 21. Specifically, the output of splitter/combiner 23 is coupled so that Reflected Pulse 43 may be transmitted to amplifier 45, the output of which (Reflected Pulse 48) is coupled to demodulator 49. Demodulator 49 is further coupled to amplifier 47, which is further coupled to pulse router 21 so that demodulated Reflected Pulse 51 ("Reflected Pulse 51") output by demodulator 49 may be passed through amplifier 47 (as Reflected Pulse 27) to pulse router 21. Pulse router 21 is coupled between amplifier 47 and TDR 13 so that Reflected Pulse 27 may be passed to TDR 13.

In operation, TDR Output Pulse 25 is output from TDR 13 to pulse router 21. In this example, TDR Output Pulse 25 has a center frequency of zero and a pulse width of 100 ns which corresponds to a bandwidth of 10 MHz (as shown in FIGS. 2(a) and 2(b)). Thus TDR 13, without the aid of interface 11, can detect only a fault which occurs in the 0 MHz to +5 MHz frequency range.

Pulse router 21 is configured so that Reflected Pulse 27 is passed to TDR 13 while preventing Reflected Pulse 27 from being passed through shape control circuit 28 to modulator 30 (thereby preventing the triggering of modulator 30). Pulse router 21 may comprise a splitter/combiner network as used to pass Output Pulse 41 to Test System 15. Alternatively, pulse router 21 may comprise an inhibit circuit which, after passing TDR Output Pulse 25 to shape control circuit 28, will allow no other pulses to reach shape control circuit 28 until after a given time period has passed. The time period is chosen such that it exceeds the longest possible time it could take a pulse to travel to a fault, be reflected by the fault and return to TDR 13.

Pulse router 21 passes TDR Output Pulse 25 to shape control circuit 28, which modifies the bandwidth, and therefore the shape, of TDR Output Pulse 25 (creating output pulse 29). Thereafter, output pulse 29 is passed to modulator 30 which combines TDR Output Pulse 25 with RF signal 33 to generate Output Pulse 37. RF signal 33 is generated by RF oscillator 31. The frequency of RF signal 33 may be operator controlled via frequency control 32 (which may be a potentiometer or other equivalent adjustment means), thereby allowing the operator to control the frequency of Output Pulse 37. In this example, the frequency of RF signal 33 will be assumed to be 500 MHz. Thus, Output Pulse 37 (as shown in FIG's. 3(a) and 3(b)) will have a center frequency of 500 MHz and may have a bandwidth of 10 MHz (assuming in this example that shape control circuit 28 does not alter the bandwidth of TDR output pulse 25). Specifically, Output Pulse 37 will have a center frequency equal to the frequency of RF signal 33 and a bandwidth equal to the bandwidth of output pulse 29.

The shape of Output Pulse 37 can be operator controlled via a potentiometer or other adjustment means, coupled to shape control circuit 28. Modulator 30 comprises a variable gain amplifier which will cause the shape of Output Pulse 37 to mimic the shape of Output Pulse 29. For example, some TDR's output a Gaussian shape pulse—with the use of modulator 30, the shape of Output Pulse 37 will be Gaussian also (assuming no modification by shape control circuit 28).

After being output by modulator 30, Output Pulse 37 is amplified by amplifier 35 (creating Output Pulse 41) and passed through splitter/combiner 23 to Test System 15.

Within Test System 15, a portion of Output Pulse 41 will be reflected by the first fault encountered and will return to splitter/combiner 23 as Reflected Pulse 43. The remaining portion of Output Pulse 41 continues traveling through Test System 15 until it reaches another fault, where a second portion is reflected to splitter/combiner 23. Portions of Output Pulse 41 will continue to be reflected by additional faults encountered as Output Pulse 41 completes its travel through Test System 15.

Splitter/combiner 23 will direct Reflected Pulse 43 to amplifier 45 where Reflected Pulse 43 will be amplified to form Reflected Pulse 48. Reflected pulse 48 will be passed to demodulator 49 where it will be demodulated (thereby returning it to a center frequency of zero). In a preferred embodiment, demodulator 49 comprises a high speed rectifier which generates Reflected Pulse 51, having a center frequency of zero and a bandwidth of 10 MHz.

Reflected Pulse 51 is then amplified by amplifier 47, forming Reflected Pulse 27. Reflected Pulse 27 is then passed through pulse router 21 to TDR 13. As described previously, pulse router 21 is configured so as to prevent Reflected Pulse 27 from being passed to modulator 30.

Thus, TDR 13, which outputs standard low frequency TDR Output Pulse 25 (having a pulse width of 100 ns, which corresponds to a bandwidth of 10 MHz and a center frequency of zero), will receive a low frequency Reflected Pulse 27 (having a bandwidth of 10 MHz and a center frequency of zero). Through use of the above described apparatus and method, TDR 13 can determine the location and magnitude of each fault within Test System 15. In the example above, faults are detected despite the fact that they occur in the 495 to 505 MHz range, and are therefore outside the bandwidth of TDR Output Pulse 25. In order to detect faults occurring at other frequencies, an operator need only adjust frequency control 32.

The apparatus of the present invention is substantially invisible to TDR 13, creating only a small constant time delay. A user may manually compensate for this delay, or when the apparatus of the invention is incorporated within a standard TDR, the TDR circuitry may be adjusted to automatically compensate for the delay in a manner known to a worker of ordinary skill in the art.

The foregoing description discloses only the preferred embodiment of the invention. Modification of the above disclosed apparatus and method which fall within the scope of the invention will be readily apparent to those skilled in the art. For example, amplifiers could be added to or removed from the preferred circuit diagram disclosed. As well, the splitter/combiner circuits and pulse routers can be replaced with equivalent circuitry known to those of ordinary skill in the art, such as directional couplers, or a switch which will switch from transmit to receive mode at the appropriate time. The modulator may comprise a voltage variable attenuator, a pin diode or a mixer instead of the variable gain amplifier disclosed above, demodulator 49 may comprise a mixer which combines RF signal 33 with reflected pulse 48, and may include filtering. RF oscillator 31 may comprise a voltage controlled oscillator, or frequency synthesizer, or other equivalent circuitry. In sum, the specific circuitry disclosed and the connections therebetween may be varied, specific components may be substituted with equivalent components and the number of components (i.e., number of amplifiers, pulse routers, etc. may be increased or reduced and still remain within the scope of the present invention).

While the present invention has been disclosed in connection with the preferred embodiment thereof, it should be understood that there may be other embodiments which fall within the spirit and scope of the invention as defined by the following claims.

What is claimed is:

1. An interface apparatus for coupling a relatively low bandwidth time domain reflectometer (TDR) to a system under test to permit said system to be tested with said TDR at a selected one of a plurality of frequencies lying within a range of transmission frequencies carried by said system said apparatus comprising:

TDR coupling means for coupling a pulse signal generated by said TDR to said apparatus and for coupling a fault reflected siqnal at said TDR frequency to said TDR;

a transmitting system comprising:
  a selectable frequency oscillator operative to produce a selected carrier frequency in accordance with a frequency control input;
  a modulator coupled to receive said TDR pulse signal and said selected carrier frequency, for producing a system test pulse signal at said selected carrier frequency;

a receiving system comprising:
  a demodulator for converting a fault reflected signal received from said system under test at said selected carrier frequency to a frequency of said TDR; and
  system coupling means operatively coupling said system test pulse signal to said system under test and coupling said fault reflected signal received from said system under test to said apparatus.

2. The apparatus of claim 1 wherein the transmitting system further comprises an amplifier means for amplifying a signal to be transmitted to the system under test.

3. The apparatus of claim 1 wherein the receiving system further comprises an amplifier means coupled between the system coupling means and the demodulator means for amplifying a received signal.

4. The apparatus of claim 1 wherein the receiving system further comprises an amplifier means coupled between the demodulator means and the TDR coupling means.

5. The apparatus of claim 1 wherein the TDR coupling means comprises a first TDR coupling means within the transmitting system and a second TDR coupling means within the receiving system.

6. The apparatus of claim 1 wherein the system coupling means comprises a first system coupling means within the transmitting system and a second system coupling means within the receiving system.

7. The apparatus of claim 1 wherein the TDR coupling means comprises a pulse router.

8. The apparatus of claim 1 wherein the system coupling means comprises a pulse router.

9. The apparatus of claim 1 wherein the system coupling means comprises a splitter/combiner.

10. The apparatus of claim 1 wherein the transmitting system further comprises a signal shape control means for controlling the shape of a modulated signal output to the system under test.

11. The apparatus of claim 10 wherein the signal shape control means comprises a low pass filter.

12. The apparatus of claim 1 wherein the TDR coupling means comprises a splitter/combiner.

13. The apparatus of claim 1 wherein the TDR coupling means comprises an inhibit circuit.

14. An improved time domain reflectometer (TDR) system which permits testing at a selected one of a plurality of frequencies lying within a range of frequencies carried by a system under test with a TDR pulse signal having a comparatively low bandwidth in relation to said range, said system comprising:

- a TDR for producing a comparatively low bandwidth TDR pulse signal and for processing a fault reflected signal;
- a selectable frequency oscillator, controllable to produce a carrier frequency selected within said frequency range;
- a modulator, coupled to receive said TDR pulse signal and said selected carrier frequency, to produce a system test pulse signal at said selected carrier frequency for testing said system under test; and
- a demodulator operative to convert a fault reflected signal received from said system under test at said selected carrier frequency to a frequency for processing by said TDR.

15. The apparatus of claim 1 wherein the apparatus and the TDR comprise an integral unit, said integral unit further comprising means for correcting for a time delay introduced by the apparatus.

16. A method for mapping fault locations within a transmission system comprising the steps of:

- generating a first signal at baseband, said first signal having a given bandwidth;
- generating a second signal at a selected one of a plurality of frequencies lying within a range of transmission frequencies carried by said system;
- combining said first signal and said second signal to produce a third signal at said selected frequency and having a bandwidth at least partially determined by said bandwidth of said first signal;
- transmitting said third signal to a system under test;
- receiving a first return signal as a fault reflected signal when said third signal is reflected by a first fault in said system under test;
- receiving a second return signal as a fault reflected signal when energy of said third signal is transmitted beyond said first fault and is reflected by a second fault in said system under test; and
- processing said first and second return signals to determine respective locations of said first and second faults.

17. The method of claim 16 further comprising the step of determining the magnitude of the first and second faults.

18. The method of claim 16 wherein the receiving and determining steps are repeated so as to locate faults in addition to said first and second faults.

19. The method of claim 16 wherein said step of processing includes demodulating said first and second return signals to convert said return signals to a baseband frequency.

20. The interface apparatus of claim 1 further comprising an operator control interface for providing said frequency control input.

21. The method of claim 16 wherein said step of transmitting couples said third signal to a transmission system including a transmission line formed of conductors and said range includes radio frequencies at several multiples of 100 MHz.

22. The TDR system of claim 14 wherein said range includes radio frequencies at several multiples of 100 MHz and said TDR system further comprises coupling means for coupling said system pulse signal to a system under test including a transmission line formed of conductors, said coupling means further coupling said fault reflected signal to said demodulator.

23. The interface apparatus of claim 1 wherein said system coupling means couples said system test pulse to a system under test including a transmission line formed of conductors and said range includes radio frequencies at several multiples of 100 MHz.

* * * * *